(12) United States Patent
Bajaj et al.

(10) Patent No.: US 11,211,901 B1
(45) Date of Patent: Dec. 28, 2021

(54) INTEGRATING AMPLIFIER WITH IMPROVED NOISE REJECTION

(71) Applicant: XILINX, INC., San Jose, CA (US)

(72) Inventors: Vipul Bajaj, Dublin (IE); Bruno Miguel Vaz, Sao Domingos de Rana (PT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/037,378

(22) Filed: Sep. 29, 2020

(51) Int. Cl.
  *H03F 1/26* (2006.01)
  *H03F 3/30* (2006.01)
  *H03F 3/00* (2006.01)
  *H03F 3/217* (2006.01)

(52) U.S. Cl.
  CPC ............... *H03F 1/26* (2013.01); *H03F 3/005* (2013.01); *H03F 3/2171* (2013.01); *H03F 3/2175* (2013.01)

(58) Field of Classification Search
  CPC .......... H03F 1/26; H03F 3/2175; H03F 3/005; H03F 3/2171
  USPC .............................. 330/9, 262, 264, 296–297
  See application file for complete search history.

(56) References Cited

U.S. PATENT DOCUMENTS

| | | | |
|---|---|---|---|
| 7,295,042 B2 * | 11/2007 | Hatanaka | G11C 27/024 326/112 |
| 10,033,395 B1 | 7/2018 | Vaz | |

* cited by examiner

*Primary Examiner* — Hieu P Nguyen
(74) *Attorney, Agent, or Firm* — Patterson + Sheridan, LLP

(57) ABSTRACT

An amplifier comprises a first capacitor, a second capacitor, a third capacitor, a fourth capacitor, a first transistor, a second transistor, and an output node. The first capacitor is electrically connected between a first power supply node and a first node, the second capacitor is electrically connected between the first node and a second node, the third capacitor is electrically connected between a second power supply node and a third node, and the fourth capacitor is electrically connected between the third node and a fourth node. The first transistor has a gate node electrically connected to the second node, and the second transistor has a gate node electrically connected to the fourth node. The output node is selectively connected to the first transistor and the second transistor. The first node and the third node are configured to be selectively electrically connected to a voltage node and a common voltage node.

20 Claims, 9 Drawing Sheets

INTEGRATING AMPLIFIER WITH IMPROVED NOISE REJECTION

TECHNICAL FIELD

Examples of the present disclosure generally relate to inverter based integrating amplifier configurations for reducing noise.

BACKGROUND

Inverter based integrating amplifiers are commonly utilized in open-loop, high-speed residue amplifiers for pipeline converters. These type of amplifiers include level-shifting capacitors to enable amplification and may be utilized to bias the inverter. Bias voltages for the PMOS and NMOS transistors of an inverter based integrating amplifier are set such that the transistors are at a high-impedance so that the level-shifting capacitors do not present a capacitive load. However, due to an intrinsic pseudo-differential nature of the amplifier, the transfer function (e.g., gain G) for the amplifier is the same for input common-mode and differential input signals. Accordingly, no input common-mode noise is generally rejected, and the output signal of the amplifier can include common-mode noise. Further, the common mode signal on the power supply of the PMOS and NMOS transistors has a gain from the source nodes of the transistors to the output transistors. Accordingly, such an amplifier generally does not mitigate power supply noise, and power supply noise can be present in the output signal of the amplifier.

FIG. 1 illustrates a prior art example of an inverter based amplifier 100. As is illustrated, the amplifier 100 includes a p-type transistor 110 and an n-type transistor 120. The drain nodes of the transistors 110 and 120 are electrically connected to an output node 130 via switches 112 and 122, respectively. The source node of the transistor 110 is electrically connected to a power supply node (Vdd), and the gate node of the transistor 110 is electrically connected to respective first terminals of a resistor 105 and capacitor 108. A second terminal of the resistor 105 is electrically connected to a first bias node (Pbias). The transistor 110 is a PMOS transistor. The source node of the transistor 120 is electrically connected to a ground power supply node 122, and the gate node of the transistor 120 is electrically connected to respective first terminals of a resistor 106 and capacitor 109. A second terminal of the resistor 106 is electrically connected to a second bias node (Nbias). The transistor 120 is an NMOS transistor. Respective second terminals of capacitors 108 and 109 are electrically connected to node 107 of a capacitor 104 and a switch 103. The capacitor 104 is a sampling capacitor. A second terminal of the capacitor 104 is electrically connected to a ground power supply node, and a second terminal of the switch 103 is electrically connected to the input node 102. The capacitor 104 is electrically connected to the input voltage of the input node 102 when the switch 103 closes. The impedance of the resistors 105 and 106 is set such that the level shifting capacitors 108 and 109 do not present a capacitive load when the input voltage is electrically connected to the capacitor 104. This high-impedance input node results in additional noise being amplified to the output. On top of that, the amplifier 100 does not reject common-mode noise. Further, the amplifier 100 does not reject noise injected by a power supply.

In various instances, common-mode noise may be mitigated by electrically coupling the bias voltages with corresponding capacitors. Further, in some degeneration techniques, by cross-coupling the capacitors and floating the capacitors, common-mode currents are minimized, mitigating common-mode and power supply noise. However, such a structure is slow and/or requires higher amounts of power as compared to other amplifiers. Further, the distortion cancellation in such an amplifier is sensitive to the operating region of the differential transistor pair, and the capacitors act as a supply discharge during amplification, reducing the dynamic range of the amplifier.

In various instances, mitigation of input common-mode noise is achieved using differential transistors with a tail current source, and mitigation of power supply noise is achieved by using a current source. However, using a current source increases the power and/or area requirements of the amplifier, and increases the parasitics of the amplifier. Further, the power supply for a differential transistor pair with a current source load is outside the power supply capabilities for various sub-nm process nodes.

SUMMARY

Inverter based amplifiers utilizing a pseudo-differential transistor pairs biased in an inversion region with no degeneration can exhibit improved area requirements and speed capabilities. The dynamic range of the amplifier can be increased by continuously connecting a power supply to the amplifier. Further, the inverting amplifiers can employ level-shifting capacitors and power supply noise rejection capacitors having reduced size requirements, improving the speed and reducing the area requirements of the inverting amplifiers.

Inverter based amplifiers including the common-mode noise and power supply noise mitigation techniques as described in the following disclosure can utilize level shifting capacitors and power supply rejection capacitors having a capacitance smaller than other amplifier designs. Accordingly, such inverter amplifiers can utilize less area than other inverter amplifiers. Further, the power requirements for such inverter amplifiers can be less than amplifiers employing other amplifier techniques.

In one example, an amplifier comprises a first capacitor, a second capacitor, a third capacitor, a fourth capacitor, a first transistor, a second transistor, and an output node. The first capacitor is electrically connected between a first power supply node and a first node, the second capacitor is electrically connected between the first node and a second node, the third capacitor is electrically connected between a second power supply node and a third node, and the fourth capacitor is electrically connected between the third node and a fourth node. The first transistor has a gate node electrically connected to the second node, and the second transistor has a gate node electrically connected to the fourth node. The output node is configured to be selectively electrically connected to the first transistor and the second transistor. The first node and the third node are configured to be selectively electrically connected to a voltage node and a common voltage node.

In another example described herein an analog to digital converter (ADC) comprises an amplifier. The amplifier comprises a first capacitor, a second capacitor, a third capacitor, a fourth capacitor, a first transistor, a second transistor, and an output node. The first capacitor is electrically connected between a first power supply node and a first node, the second capacitor is electrically connected between the first node and a second node, the third capacitor is electrically connected between a second power supply node and a third node, and the fourth capacitor is electrically connected between the third node and a fourth node. The first transistor has a gate node electrically connected to the second node, and the second transistor has a gate node electrically connected to the fourth node. The output node is configured to be selectively electrically connected to the first transistor and the second transistor. The first node and the third node are configured to be selectively electrically connected to a voltage node and a common voltage node.

In another example described herein a method for operating an amplifier comprises electrically connecting, during a first period, a first node and a second node to a voltage node. A first capacitor is electrically connected between the first node and a first power supply node, a second capacitor is electrically connected between the first node and a third node, a third capacitor is electrically connected between the second node and a second power supply node, and a fourth capacitor is electrically connected between the second node and a fourth node. The method further comprises electrically connecting, during a second period, the first node and the second node to a common voltage node, and electrically connecting, during the second period, a first transistor and a second transistor to an output node. A gate node of the first transistor is electrically connected to the third node, and a gate node of the second transistor is electrically connected to the fourth node.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
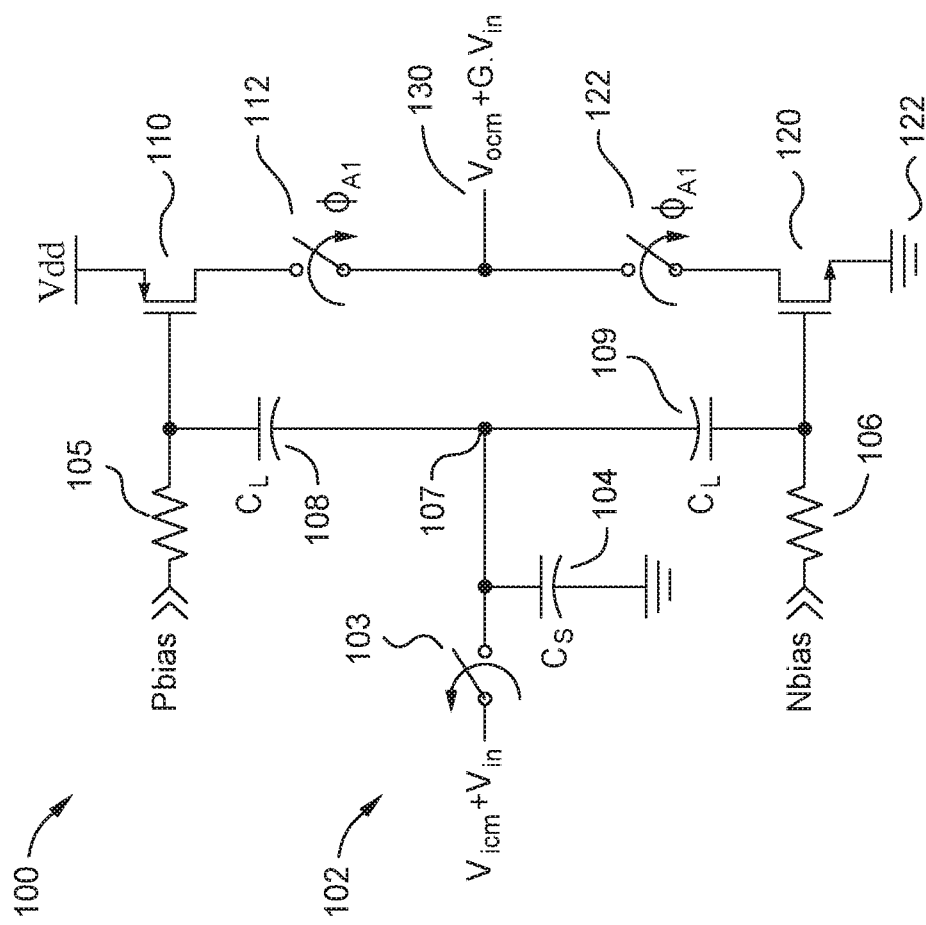
FIG. 1 depicts a prior art amplifier.

Examples herein generally relate to inverter amplifiers that can have improved common-mode noise and power supply noise mitigation. Generally, inverter amplifiers having pseudo-differential transistor pairs biased in a strong inversion region with no degeneration are described. Such amplifiers can exhibit improved area requirements and speed capabilities. For example, in such a configuration, a power supply can be continuously connected to an inverting amplifier, increasing the dynamic range of the amplifier. Further, level-shifting capacitors and power supply noise rejection capacitors can have reduced size requirements, providing improved speed and reduced area requirements. For example, the level-shifting capacitors and/or power supply noise rejection capacitors may be less than half the size of the level-shifting capacitors and power supply noise rejection capacitors of other amplifier designs.

As described in the following, inverter amplifiers utilizing the disclosed common-mode noise and/or power supply noise mitigation techniques utilize level shifting capacitors and power supply rejection capacitors having reduced capacitance. Accordingly, for a given speed requirement, such an inverter amplifier can utilize less area. Further, the power requirements for such amplifiers can be less than amplifiers employing other amplifier techniques.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Figure 2:
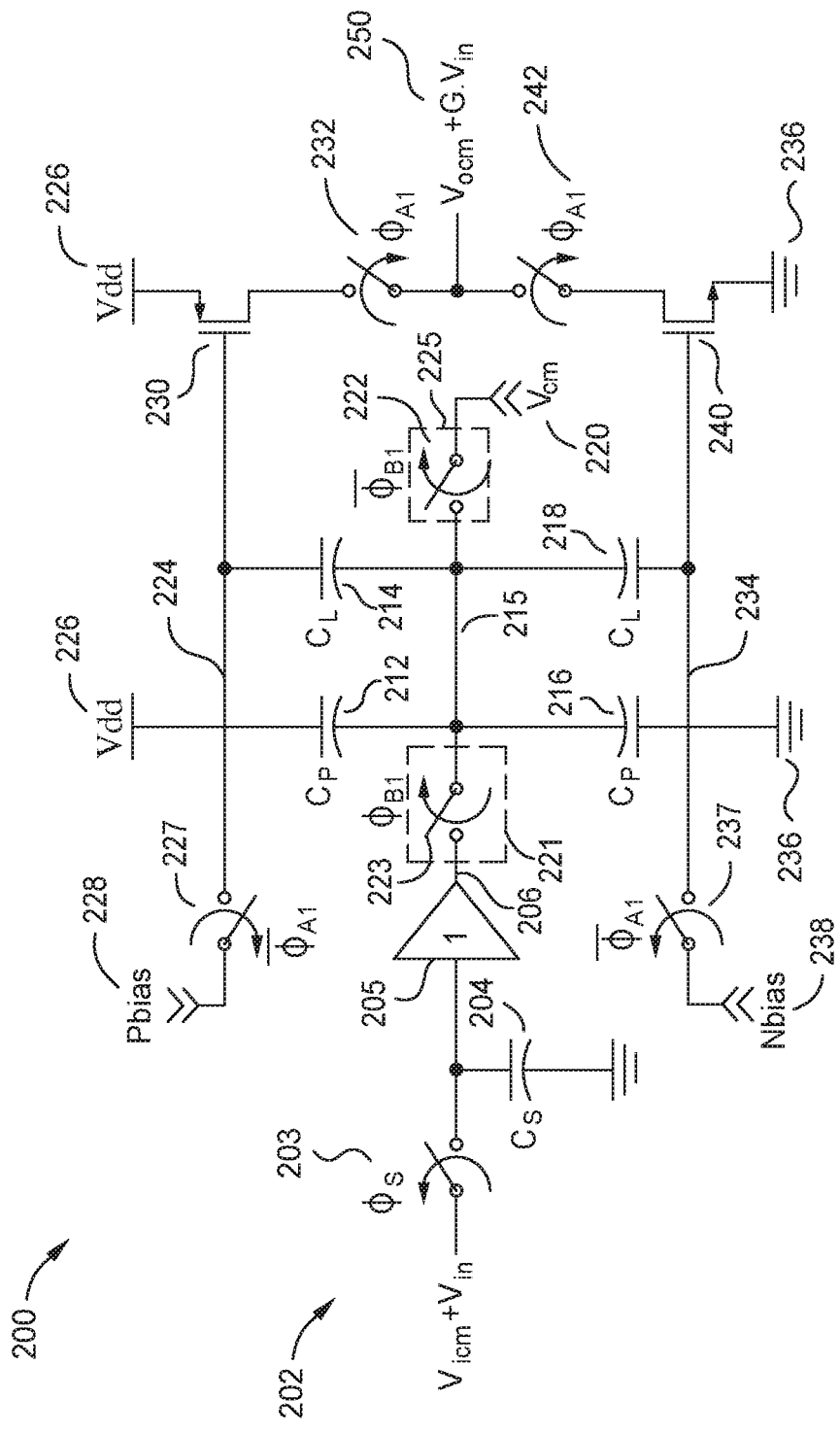
FIG. 2 depicts an amplifier according to some examples.

FIG. 2 illustrates an amplifier 200, according to one or more embodiments of the disclosure. The amplifier 200 includes an input node 202, capacitors 204, 212, 214, 216, 218, a buffer 205, switches 203, 222, 223, 227, 232, 237, and 242, transistors 230 and 240, and an output node 250. The input node 202 is selectively electrically connected to the capacitor 204 and the buffer 205 via the switch 203. The switch 203 is configured to selectively electrically connect and disconnect the input node 202 with the capacitor 204 and the input node of the buffer 205. The output node of the buffer 205 is electrically connected to the switching mechanism 221. While not illustrated, the voltage signal provided to the buffer 205 is based on the sampled voltage on the capacitor 204 when switch 203 opens and/or might be the result of any quantization and/or residue generation performed in-between the sampling instant and the buffering event and/or any other sort of analog or mixed signal processing function.

A first terminal of the capacitor 212 is electrically connected to the power supply node 226, and a second terminal of the capacitor 212 is electrically connected to the node 215. A first terminal of the capacitor 214 is electrically connected to the node 224, and a second terminal of the capacitor 214 is electrically connected to the node 215. A first terminal of the capacitor 216 is electrically connected to the power supply node 236, and a second terminal of the capacitor 216 is electrically connected to the node 215. A first terminal of the capacitor 218 is electrically connected to the node 234, and a second terminal of the capacitor is electrically connected to the node 215.

The switching mechanism 221 includes the switch 223. The switching mechanism 221 selectively electrically connects and disconnects the voltage node 206 of the buffer 205 from the node 215. Accordingly, the switching mechanism 221 selectively electrically connects and disconnects respective terminals of the capacitors 212, 214, 216, and 218 from the voltage node 206 of the buffer 205.

The switching mechanism 225 includes the switch 222 and selectively electrically connects and disconnects the node 215 to and from a common voltage, which can be generated by a power supply, at the common voltage node 220. Accordingly, the switching mechanism 225 selectively electrically connects and disconnects respective terminals of the capacitors 212, 214, 216, and 218 to and from the common voltage at the common voltage node 220.

The power supply node 226 is configured to provide a power supply voltage Vdd. The power supply node 236 provides a ground voltage.

The switch 227 is configured to selectively electrically connect and disconnect a bias voltage node 228 to and from the node 224. The bias voltage node 228 is configured to provide a bias voltage Pbias.

The switch 237 configured to selectively electrically connect and disconnect a bias voltage node 238 to and from the node 234. The bias voltage node 238 is configured to provide a bias voltage Nbias.

The source node of the transistor 230 is electrically connected to the power supply node 226. The gate node of the transistor 230 is electrically connected to the node 224, and the drain node of the transistor 230 is selectively electrically connected to the output node 250 via a switch 232. The transistor 230 is a p-type field effect transistor (FET).

The source node of the transistor 240 is electrically connected to the power supply node 236. The gate node of the transistor 240 is electrically connected to the node 234, and the drain node of the transistor 240 is selectively electrically connected to the output node 250 via a switch 242. The transistor 240 is an n-type FET.

The output node 250 outputs an output voltage. The output voltage corresponds to a transfer function based on the input voltage provided by the input node 202 and a gain factor of the amplifier. The gain factor can be one or more. Further, the output voltage includes common mode and differential noise.

The capacitors 214 and 218 are configured to function as level shifting capacitors configured to sample bias voltages provided by bias power supplies via the bias voltage nodes 228 and 238.

The capacitors 212 and 216 function as power supply rejection capacitors reducing noise coming from power supply nodes 226 and 236. For example, the capacitors 212 and 216 function as sampling capacitors coupling the variation in the power supply signals provided via the power supply nodes 226 and 236 to the gate nodes of the transistors 230 and 240. Utilizing the capacitors 212 and 216 can reduce the power supply noise in a range of about 8 dB to 15 dB. The capacitors 212 and 216 attenuates common mode noise sampled on node 215 coming from the buffer 205 and filters switch resistance noise that may occur during an amplification phase. For example, the capacitors 212 and 216 attenuate the common mode noise by a factor of at least about 4.

Figure 3:
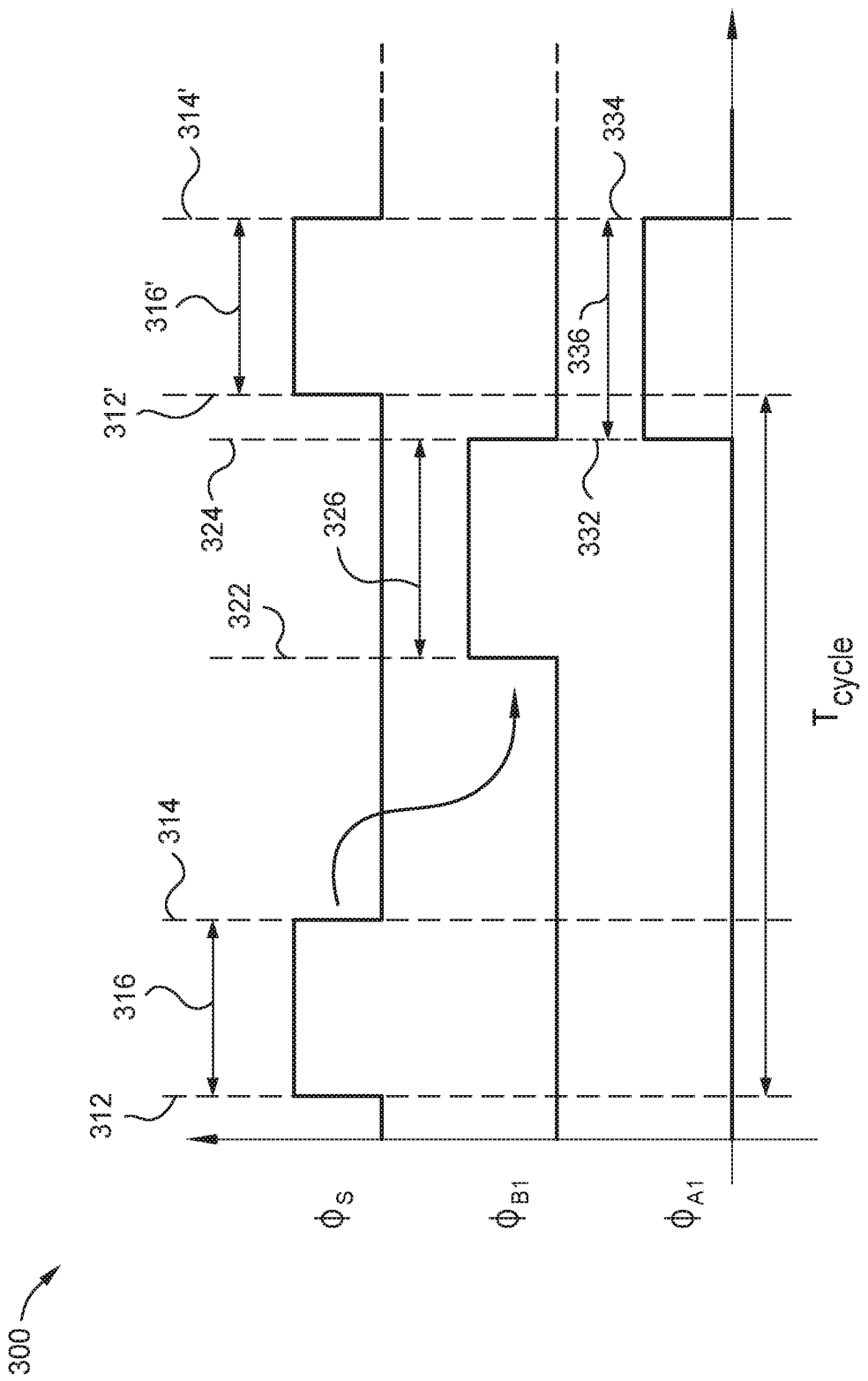
FIG. 3 depicts a timing diagram for operating an amplifier according to some examples.

FIG. 3 is a timing diagram illustrating timing periods based on control signals $\phi_S$, $\phi_{B1}$, and $\phi_{A1}$. The control signal $\phi_S$ has rising edge 312 and falling edge 314, having a period 316 between the rising edge 312 and falling edge 314. The control signal $\phi_{B1}$ has rising edge 322 and falling edge 324, having a period 326 between the rising edge 322 and falling edge 324. The control signal $\phi_{A1}$ has rising edge 332 and falling edge 334, having a period 336 between the rising edge 332 and falling edge 334. Each of complement control signals $\overline{\phi}_{B1}$ and $\overline{\phi}_{A1}$ (not illustrated in FIG. 3) is a logical complement of the respective control signal $\phi_{B1}$ and $\phi_{A1}$. The control signals $\phi_S$, $\phi_{B1}$, and $\phi_{A1}$ may be provided by timing control circuitry electrically connected to the amplifier 200. The timing control circuitry may be one of synchronous or asynchronous circuitry. Further, the control signals $\phi_S$, $\phi_{B1}$, and $\phi_{A1}$ may be provided in response to one or more of a sampling function, a quantization function, a buffering function, a reset function, and an amplification function, among others. In one or more examples, the amplifier 200 comprises or is electrically connected to one or more delay cells configured to generate one or more of the control signals $\phi_S$, $\phi_{B1}$, and $\phi_{A1}$.

Generally, when the control signal $\phi_S$ is logically low, the switch 203 is in an open state, and when the control signal $\phi_S$ is logically high, the switch 203 is in a closed state. When the control signal $\phi_{A1}$ is logically low and complement control signal $\overline{\phi}_{A1}$ is responsively logically high, the switches 232 and 242 are in an open state, and the switches 227 and 237 are in a closed state. When the control signal $\phi_{A1}$ is logically high and complement control signal $\overline{\phi}_{A1}$ is responsively logically low, the switches 232 and 242 are in a closed state, and the switches 227 and 237 are in an open state. When the control signal $\phi_{B1}$ is logically low and complement control signal $\overline{\phi}_{B1}$ is responsively logically high, the switch 223 is in an open state, and the switch 222 is in a closed state. When the control signal $\phi_{B1}$ is logically high and complement control signal $\overline{\phi}_{B1}$ is responsively logically low, the switch 223 is in a closed state, and the switch 222 is in an open state.

With reference to FIG. 2, in response to the rising edge 312 of the control signal $\phi_S$, the switch 203 is placed in a closed state from an open state, electrically connecting the input node 202 with the input node of the buffer 205 and the terminal of the capacitor 204. The switch 203 being in a closed state charges the capacitor 204 to the voltage of the input node 202. During the period 316 with the control signals $\phi_{A1}$ and $\phi_{B1}$ being logically low (and the complementary control signals $\overline{\phi}_{A1}$ and $\overline{\phi}_{B1}$ being logically high), the switches 222, 227, and 237 are in a closed state, and switches 223, 232, and 242 are in an open state. The switch 223 being in an opened state electrically disconnects the output node (e.g., voltage node 206) of the buffer 205 from the capacitors 212, 214, 216, and 218. Further, the switches 227 and 237 being in a closed state electrically connects the bias voltage node 228 with a terminal of the capacitor 214, and electrically connects the bias voltage node 238 with a terminal of the capacitor 218. The switch 222 being in a closed state electrically connects the common voltage node 220 with the node 215. Accordingly during the period 316 and, further, during the time period from the falling edge 314 to the rising edge 322 when the control signals $\phi_{A1}$ and $\phi_{B1}$ are logically low, the capacitor 214 is charged to a difference between the bias voltage provided by at the bias voltage node 228 and the common voltage at the common voltage node 220. The capacitor 218 is charged to a difference between the bias voltage provided by at the bias voltage node 238 and the common voltage at the common voltage node 220. The capacitor 212 is charged to a difference between the voltage provided by at the power supply node 226 and the common voltage at the common voltage node 220. Further, the capacitor 216 is charged to a difference between the voltage provided by at the power supply node 236 and the common voltage at the common voltage node 220.

In response to the falling edge 314 of the control signal $\phi_S$, the switch 203 is placed in an open state from a closed state, disconnecting the input node of the buffer 205 and the terminal of the capacitor from the input node 202. With a high impedance input node of the buffer 205, the capacitor 204 can generally maintain the voltage to which it was charged while the switch 203 was in a closed state.

In response to the rising edge 322 of the control signal $\phi_{B1}$, the switch 223 is placed in a closed state from an opened state electrically connecting the voltage node 206 of the buffer 205 to the node 215. Further, in response to the rising edge 322 (and hence, a falling edge of the complement control signal $\overline{\phi}_{B1}$), the switch 222 is placed in an opened state from a closed state, disconnecting the output of the common voltage node 220 form the node 215. Further, during the period 326 with the control signals $\phi_S$ and $\phi_{A1}$ being logically low (and the complementary control signal $\overline{\phi}_{A1}$ being logically high), the switches 227 and 238 are in a closed state, and the switches 203, 232, and 242 are in an opened state. Electrically coupling the voltage node 206 of the buffer 205 with the node 215, while disconnecting the common voltage node 220 from the node 215, couples a terminal of each of the capacitors 212, 214, 216, and 218 with a voltage provided at the voltage node 206 of the buffer 205. Accordingly, during the period 326, the capacitor 214 is charged to a difference between the bias voltage provided at the bias voltage node 228 and the voltage (e.g., a residue voltage) at the voltage node 206 of the buffer 205. During the period 326, the capacitor 218 is charged to a difference between the bias voltage provided at the bias voltage node 238 and the voltage at the voltage node 206 of the buffer 205. During the period 326, the capacitor 212 is charged to a difference between the voltage provided at the power supply node 226, and the voltage at the voltage node 206 of the buffer 205. Further, during the period 326, the capacitor 216 is charged to a difference between the voltage provided at the power supply node 236 and the voltage at the voltage node 206 of the buffer 205. The period 326 may be referred to as a buffer period.

The switch 223 is placed in an open state from the closed state in response to the falling edge 324 of the control signal $\phi_{B1}$, electrically disconnecting the voltage node 206 of buffer 205 from the node 215. Further, in response to the falling edge 324 (and hence, a rising edge of the complement control signal $\overline{\phi}_{B1}$), the switch 222 is placed in a closed state from an open state, electrically connecting the common voltage node 220 with the node 215.

Tcycle is a time period that corresponds to period of time between the rising edge 312 of the control signal $\phi_S$ and the next rising edge 312 (e.g., edge 312') of the control signal $\phi_S$.

In response to the rising edge 332 of the control signal $\phi_{A1}$, switches 232 and 242 are placed in a closed state from an open state. Further, in response to the rising edge 332 (and hence, a falling edge of the complement control signal $\overline{\phi}_{A1}$), the switches 227 and 237 are placed in an open state from a closed state. Closing the switch 232 electrically connects the drain node of the transistor 230 with the output node 250. Closing the switch 242 electrically connects the drain node of the transistor 240 with the output node 250. Further, opening the switch 227 electrically disconnects the node 224 from the bias voltage node 228, and opening the switch 237 electrically disconnects the node 234 from the bias voltage node 238. Further, during the period 336 with the control signal $\phi_{B1}$ being logically low (and the complementary control signal $\overline{\phi}_{B1}$ being logically high), the switch 223 is in an opened state, and the switch 222 is in a closed state. The switch 222 being in a closed state electrically connects the common voltage of the common voltage node 220 with the node 215, and the switch 223 being in an opened state electrically disconnects the voltage node 206 of the buffer 205 from the node 215. Accordingly, the gate node of the transistor 230 is driven by the voltage on the node 224, which is based on the voltage on the capacitor 214 and the voltage on the common voltage node 220, during the period 336, and the gate node of the transistor 240 is driven by the voltage on the node 234, which is based on the voltage on the capacitor 218 and the voltage on the common voltage node 220, during the period 336.

As a terminal of each of the capacitors 214 and 218 is coupled to the bias voltage nodes 228 and 238, respectively, input common-mode noise is mitigated. During period 336, the capacitors 212 and 216 filter the noise of the shorting switches that generate the differential signal for the amplification in the period 336.

The capacitors 212 and 216 couple a common supply variation from the power supply nodes 226 and 236 to the gate nodes of transistor 230 and 240. The capacitors 212 and 216 couple any change in the power supply node 226 and 236 after period 316 to the gate nodes of the transistors 230 and 240 to mitigate variation during the amplification period 336 reducing power supply noise coupled to the output (e.g., the output node 250).

During period 336, an output voltage is generated at the output node 250. The output voltage is a gain "G" multiplied version of the input voltage generated by the input node 202. For example, the output voltage is $V_{ocm}+G(V_{in})$, where $V_{ocm}$ is a common voltage. The gain "G" is one or more.

In response to the falling edge 334 of the control signal $\phi_{A1}$, the switches 232 and 242 are moved from a closed state to an open state, and the switches 227 and 237 are moved from an open state to a closed state.

As illustrated in FIG. 3, a period 316' of the control signal $\phi_S$ and corresponding to a rising edge 312' and falling edge 314' of the control signal $\phi_S$ occurs during at least a portion of the period 336. For example, the rising edge 312' occurs after the rising edge 332 and before the falling edge 334. Further, the falling edge 314' occurs after the rising edge 332, and can occur before, after, or aligned with the falling edge 334. Accordingly, during at least a portion of the period 336, the switch 203 is placed in a closed position from an opened position in response to the rising edge 312', and is placed in an opened position from a closed position in response to the falling edge 314'. Positioning the switch 203 in a closed position from an opened position, electrically connects the input node 202 with a terminal of the capacitor and the input node of the buffer 205.

Figure 4:
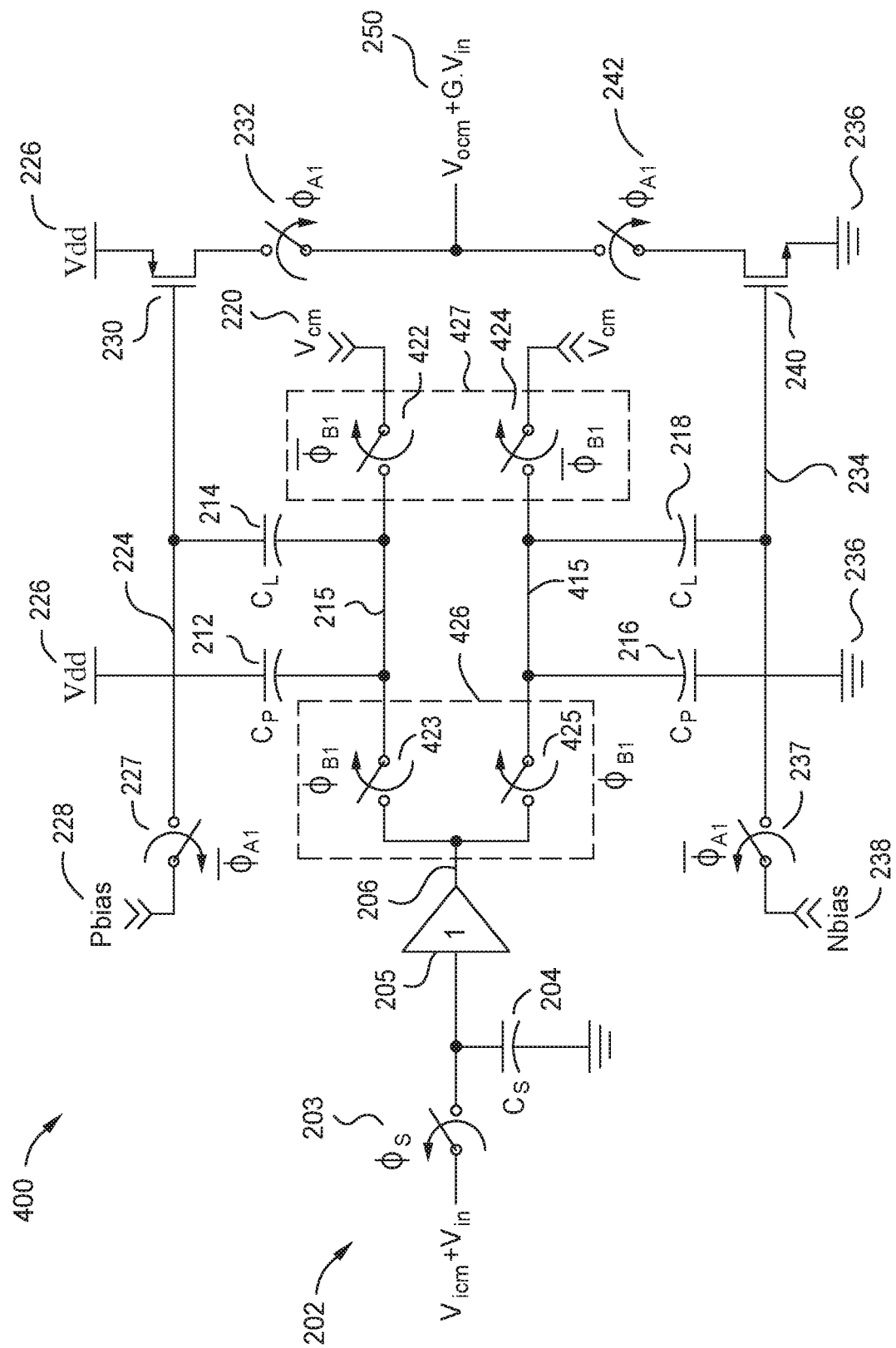
FIGS. 4, 5, and 6 depict amplifiers according to some examples.

FIG. 4 illustrates an amplifier 400, according to one or more embodiments. The amplifier 400 is configured similar to that of the amplifier 200 of FIG. 2. For example, the amplifiers 200 and 400 include input node 202, buffer 205, switches 203, 227, 232, 237, and 242, capacitors 204, 212, 214, 216, and 218, buffer 205, transistors 230 and 240, and output node 250. As compared to the amplifier 200, the amplifier 400 includes switches 422-425. Further, respective terminals of the capacitors 216 and 218 are electrically connected to node 415 in FIG. 4, as opposed to the node 215 in FIG. 2. The switches 423 and 425 form the switching mechanism 426. The switching mechanism 426 selectively couples and decouples the node 215 and the node 415 to and from the voltage node 206 of the buffer 205. The switches 422 and 424 form the switching mechanism 427. The switching mechanism 427 selectively couples and decouples the node 215 and the node 415 to and from the common voltage node 220. The switch 422 selectively electrically connects the node 215 to the common voltage node 220 and the switch 423 selectively electrically connects the node 215 to the voltage node 206 of the buffer 205. Further, the switch 424 selectively electrically connects the node 415 to the common voltage node 220, and the switch 425 selectively electrically connects the node 415 to the voltage node 206 of the buffer 205. Utilizing four switches (e.g., the switches 422-425) instead of two switches further mitigates noise generated within the amplifier 400.

With reference to the timing diagram of FIG. 3, the amplifier 400 functions similar to that of the amplifier 200. However, as the amplifier 400 includes node 415 in addition to the node 215 and four switches (e.g., the switches 422-425) instead of two switches (e.g., the switches 222 and 223), in response to the rising edge 322, the switches 423 and 425 are positioned in a closed state from an open state, and the switches 422 and 424 are positioned in an opened state from a closed state. Accordingly, during the period 326, the nodes 215 and 415 are electrically connected to the voltage node 206 of the buffer 205, and are electrically disconnected from the common voltage node 220. Further, during the periods 316 and 336, the switches 423 and 425 are positioned in an opened state, electrically disconnecting the voltage node 206 of the buffer 205 from the nodes 215 and 415. The switches 422 and 425 are positioned in a closed state during the periods 316 and 336, electrically connecting the nodes 215 and 415 with the common voltage node 220. The amplifier 400 functions similar to that of the amplifier 200 in response to the control signals $\phi_S$ and $\phi_{A1}$.

Figure 5:
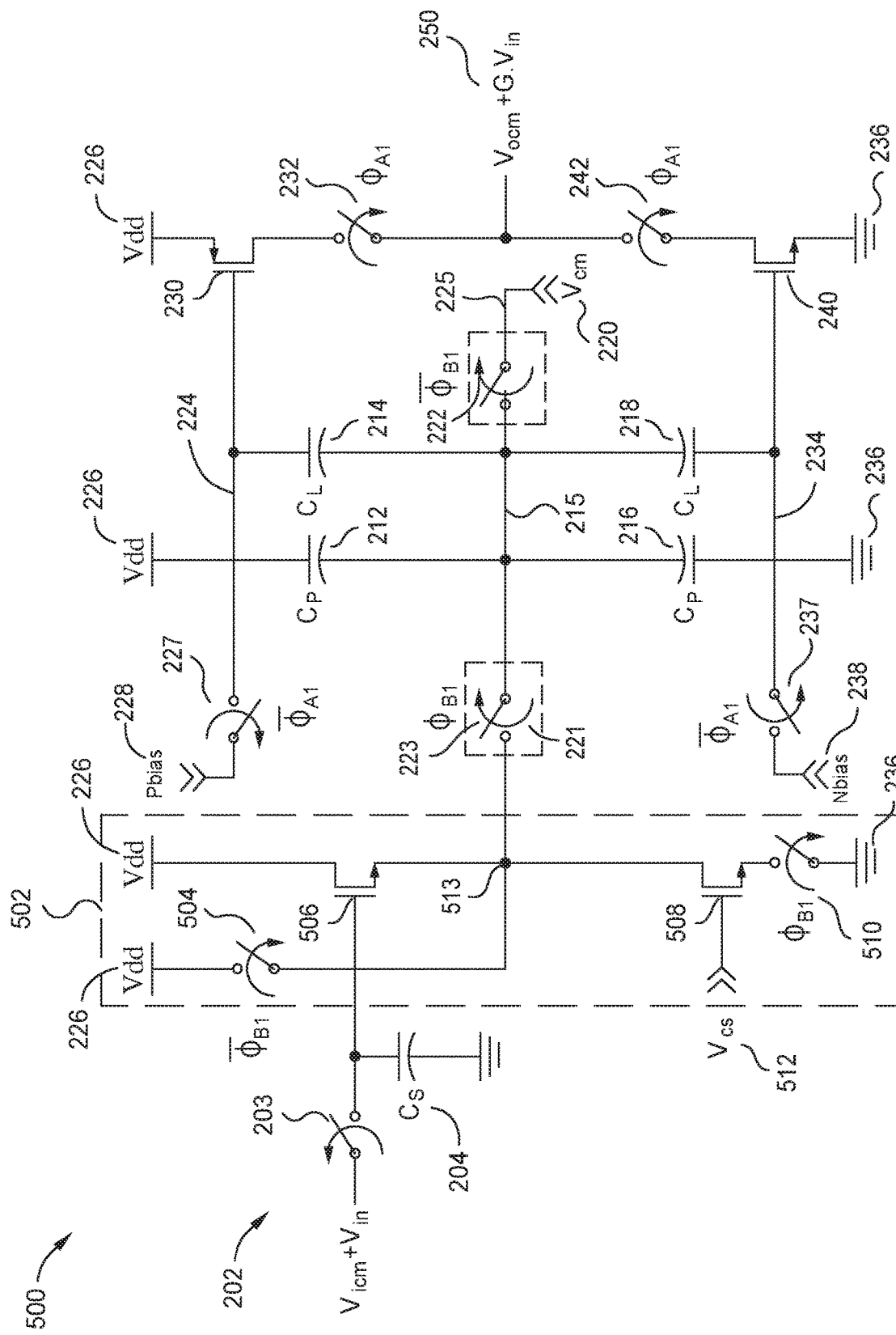

FIG. 5 illustrates an amplifier 500, according to one or more embodiments. The amplifier 500 is configured similar to that of the amplifier 200. For example, the amplifier 500 includes input node 202, switches 203, 222, 223, 227, 232, 237, and 242, capacitors 204, 212, 214, 216, and 218, transistors 230 and 240, and output node 250. As compared to the amplifier 200, the amplifier 500 includes a source follower 502 instead of the buffer 205. The source follower 502 includes switches 504 and 510, and transistors 506 and 508. The gate node of the transistor 506 is selectively electrically connected to the input node 202 via the switch 203. The drain node of the transistor 506 is electrically connected to the power supply node 226, and the source node of the transistor 506 is electrically connected to voltage node 513, e.g., an output node of the source follower 502. The gate node of the transistor 508 is selectively electrically connected to the bias voltage node Vcs 512. The source node of the transistor 508 is selectively electrically connected to the power supply node 236 via the switch 510, and the drain node of the transistor 508 is electrically connected to voltage node 513. The switch 504 selectively electrically connects and disconnects the power supply node 226 to and from the voltage node 513.

The amplifier 500 functions similar to that of the amplifier 200 during periods 316 and 336. Further, during period 326, the amplifier 500 functions similar to that of the amplifier 200, while additionally controlling the functionality of the source follower 502. For example, in response to the rising edge 322, the switch 510 is positioned in a closed state from an opened state, and the switch 504 is positioned in an opened state from a closed state. In response to the falling edge 324, the switch 510 is positioned in an opened state from a closed state, and the switch 504 is positioned in a closed state from an opened state. During the period 326, the power supply node 226 is electrically disconnected from the voltage node 513 via the switch 504, and the source node of the transistor 508 is electrically connected to the power supply node 236 via the switch 510. Accordingly, the output of the transistors 506 and 508 is output by the source follower 502 at voltage node 513. For example, the output of the source follower 502 is based on the voltage on the capacitor 204, which was previously (e.g., during period 316) based on the voltage of the input node 202 (e.g., Vicm+Vin). In response to the rising edge 324, the switch 510 is placed in an opened state from a closed state, and the switch 504 is placed in a closed state from an opened state. Accordingly, an electrical connection between the power supply node 226 and the voltage node 513 is formed bypassing the transistor 506. Further, in response to the falling edge 324, the source node of the transistor 508 is electrically disconnected from the power supply node 236.

Figure 6:
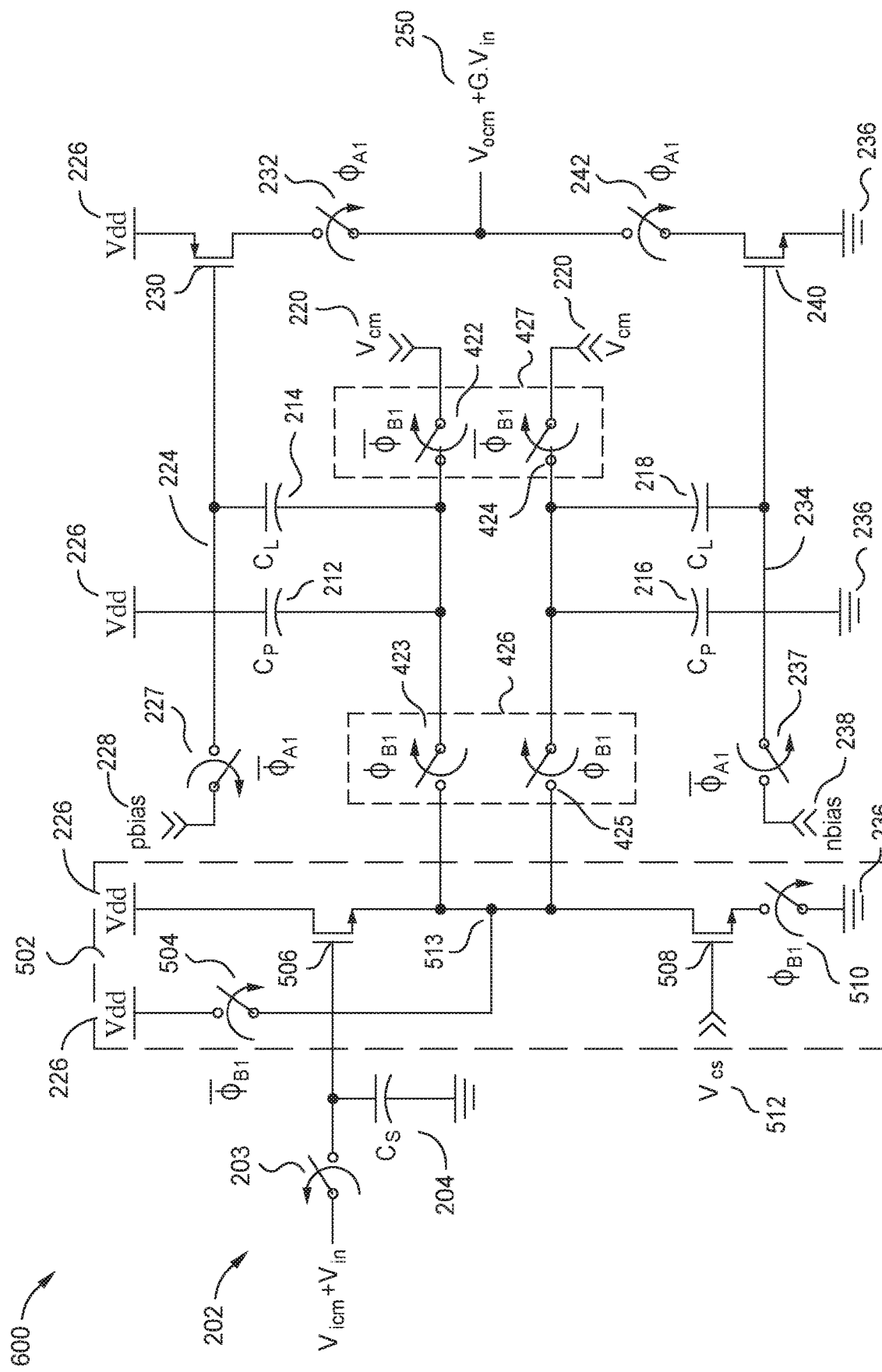

FIG. 6 illustrates an amplifier 600, according to one or more embodiments. The amplifier 600 is configured similar to that of the amplifier 400. For example, the amplifier 600 includes input node 202, switches 203, 227, 232, 237, 242, 422, 423, 424, and 425, capacitors 204, 212, 214, 216, and 2218, transistors 230 and 240, and output node 250. As compared to the amplifier 400, the amplifier 600 includes a source follower 502 instead of the buffer 205. The amplifier 600 functions similar to that of the amplifier 400 during periods 316 and 336. Further, during period 326, the amplifier functions similar to that of the amplifier 400, and, additionally, the functionality of the source follower 502 is controlled during the period 326, and similar as is described above with regard to FIG. 5.

Figure 7:
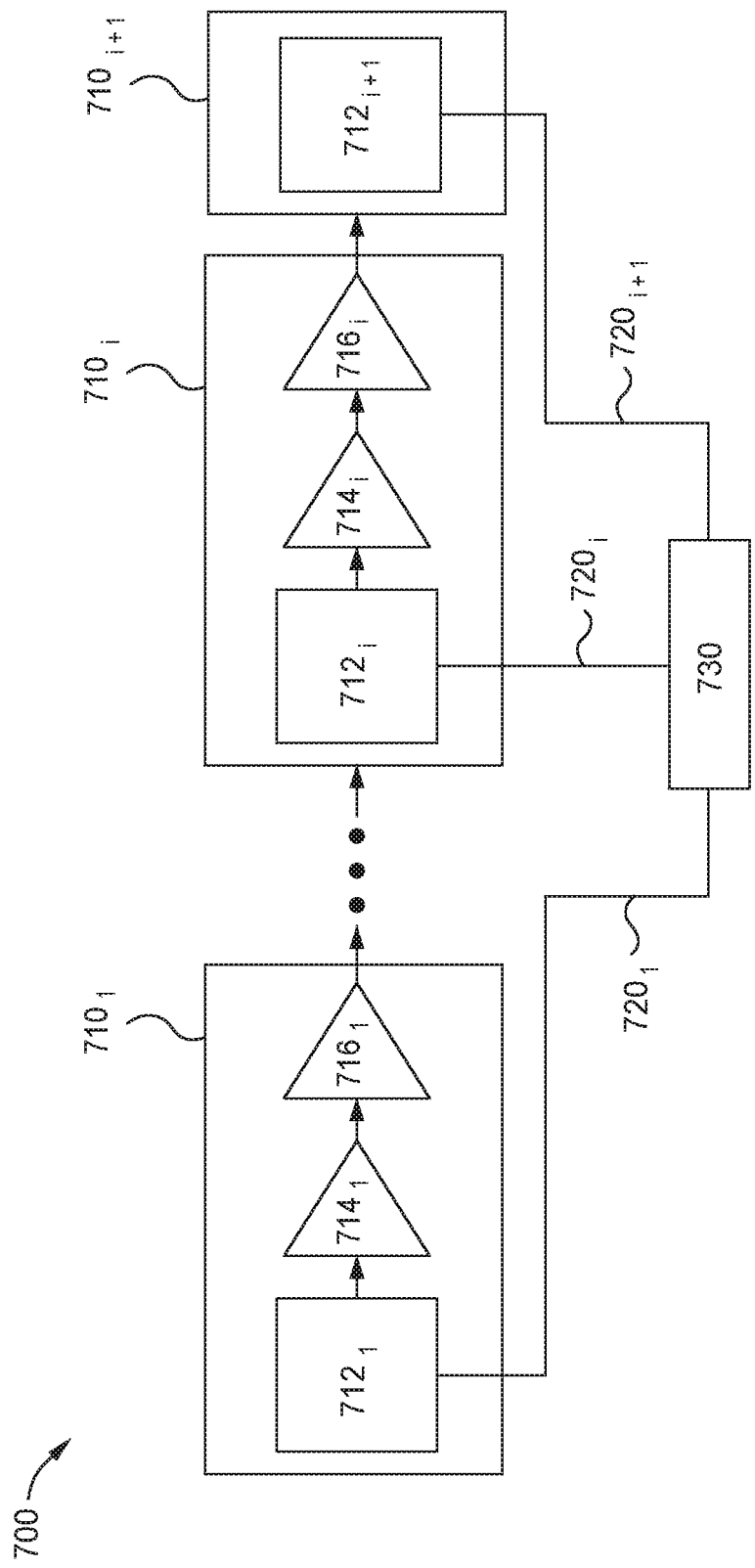
FIG. 7 illustrates an analog-to-digital converter according to some examples.

FIG. 7 illustrates an ADC 700 having a pipelined configuration, according to one or more embodiments of the invention. The ADC 700 may be a successive approximation register (SAR) ADC. The ADC 700 includes ADC blocks 710. For example, the ADC 700 includes ADC blocks $710_1$, $710_i$, and $710_{i+1}$, where "i" is 2 or more. In one or more embodiment, the ADC block $710_i$ and/or the ADC block $710_{i+1}$ is omitted.

The ADC blocks $710_1$, and $710_i$ include a corresponding stage (e.g., stage $712_1$, $712_i$), a corresponding first amplifier (e.g., the amplifier $714_1$, and $714_i$), and a corresponding second amplifier (e.g., the amplifier $716_1$, $716_i$). Each of the stages 712 has circuitry (e.g., an ADC, a digital to analog converter, and a subtractor) configured to receive and process an input signal to generate a residue voltage signal. The residue voltage signal is received by the first amplifier (e.g., the amplifier $714_1$, and $714_i$) which generates a first voltage signal (e.g., an amplified voltage signal or buffered voltage signal) based on the residue voltage signal. The second amplifier (e.g., the amplifier $716_1$, $716_i$) receives the first voltage signal and generates a second voltage signal (e.g., an amplified voltage signal) based on the first voltage signal.

The amplifiers 714 and/or 716 are configured similar to that of the amplifiers 200, 400, 500 and/or 600.

An output node of the ADC block $710_1$ is electrically connected to an input node of a subsequent ADC block $710_2$, which may be the ADC block $710_i$, such that the ADC block $710_2$ receives an output signal provided by the ADC block $710_1$. Each ADC block $710_j$ has an output node electrically connected to an input node of a subsequent ADC block $710_{(j+1)}$, where j is inclusively from 1 to (i−1). An output node of the ADC block $710_i$ is electrically connected to an input node of the ADC block $710_{i+1}$.

Each of the ADC blocks 710 receives an input signal and generates a corresponding output signal. Further, each of the ADC blocks 710 generates one or more digital bits of a corresponding digital signal 720. The digital signals 720

(e.g., digital signals $720_1$, $720_i$, and $720_{i+1}$) are provided to a processing element 730. The processing element 730 combines the digital signals 720 into a digital output signal.

Figure 8:
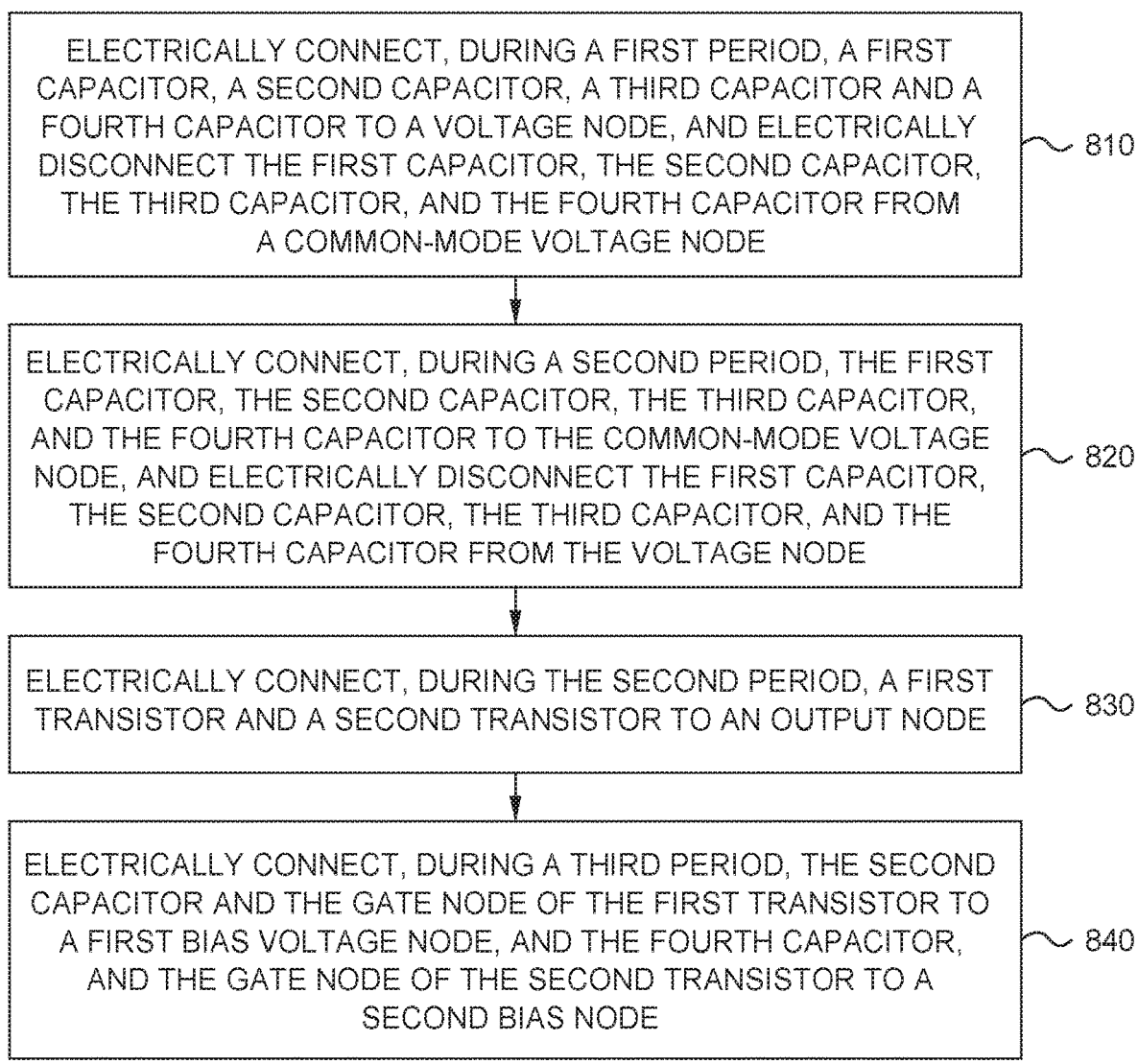
FIG. 8 illustrates a method for operating an amplifier according to some examples.

FIG. 8 illustrates a flowchart of a method 800 for operating an amplifier, according to one or more embodiments. At operation 810, during a first period, a first capacitor, a second capacitor, a third capacitor, and a fourth capacitor are electrically connected to a voltage node, and the first capacitor, the second capacitor, the third capacitor, and the fourth capacitor are electrically disconnected from a common-mode voltage node. For example, during a first period, the capacitors 212, 214, 216, and 218 are electrically connected to the voltage node 206 of the buffer 205 or the voltage node 513 of the source follower 502 via the switching mechanism 221 or 426. Further, the capacitors 212, 214, 216, and 218 are electrically disconnected from the common voltage node 220 via the switching mechanism 225 or 427.

At operation 820, during a second period, the first capacitor, the second capacitor, the third capacitor, and the fourth capacitor are electrically connected to the common-mode voltage node, and the first capacitor, the second capacitor, the third capacitor, and the fourth capacitor are electrically disconnected from the voltage node. For example, during the second period, the capacitors 212, 214, 216, and 218 are electrically connected to the common voltage node 220 via the switching mechanism 225 or 427), and the capacitors 212, 214, 216, and 218 are electrically disconnected from the voltage node 206 of the buffer 205 or voltage node 513 of the source follower 502 via the switching mechanism 221 or 426.

At operation 830, during a second period, a first transistor and a second transistor are electrically connected to an output node. For example, during the second period, the transistor 230 is electrically connected to the output node 250 via the switch 232, and the transistor 240 is electrically connected to the output node 250 via the switch 242.

At operation 840, during a third period that at least partially overlaps the first period and/or the second period, a terminal of the second capacitor and the gate node of the first transistor are electrically connected to a first bias node, and a terminal of the fourth capacitor and the gate node of the second transistor are electrically connected to a second bias voltage. For example, during the third period, a terminal of the capacitor 214 and the gate node of the transistor 230 are electrically connected to the bias voltage node 228, and a terminal of the capacitor 218 and the gate node of the transistor 240 are connected to the bias voltage node 238. The fourth period is non-overlapping with the third period.

Figure 9:
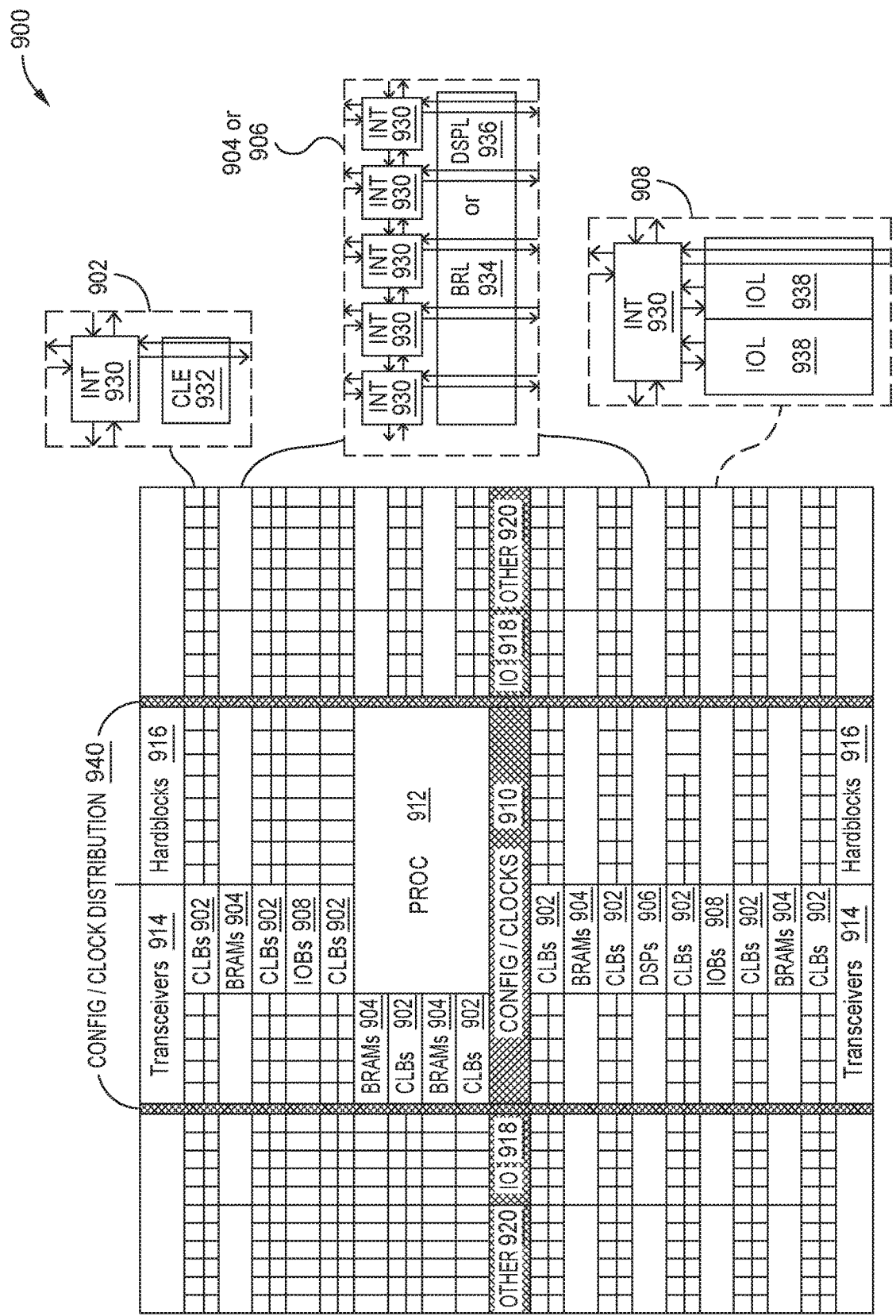
FIG. 9 illustrates a field programmable gate array (FPGA) that may be implemented as a programmable device according to some examples.

An amplifier (e.g., the amplifier 200, 400, 500 or 600) is implemented as part of an integrated circuit (IC). The IC may be part of a programmable logic device (PLD) that is programmed to perform specified logic functions. One type of PLD is a field programmable gate array (FPGA) as is illustrated in FIG. 9. The FPGA 900 may be implemented as a programmable device according to some examples. The FPGA 900 includes a large number of different programmable tiles that form a programmable fabric including configurable logic blocks (CLBs) 902, random access memory blocks (BRAMs) 904, signal processing blocks (DSPs) 906, input/output blocks (IOBs) 908, and configuration and clocking logic (CONFIG/CLOCKS) 910. The FPGA 900 also includes a dedicated processor block 912, digital transceivers 914, dedicated hardblocks 916, specialized input/output blocks (10) 918 (e.g., configuration ports and clock ports), and other programmable logic 920 such as digital clock managers, system monitoring logic, and so forth. The hardblocks 916 can be any circuit, such as a memory controller, a Peripheral Component Interconnect Express (PCIe) hardblock, etc. One or more of the hardblocks 916 includes a SAR ADC that includes any of the amplifiers described above, for example.

In the illustrated FPGA 900, each programmable tile includes a programmable interconnect element (INT) 930 having connections to input and output terminals of respective programmable interconnect elements 930 in each adjacent tile and having connections to input and output terminals of a programmable logic element within the same tile. The programmable interconnect elements 930 taken together implement a programmable interconnect structure for the illustrated FPGA 900.

As an example, a CLB 902 includes a configurable logic element (CLE) 932 that can be programmed to implement user logic plus a single programmable interconnect element 930. A BRAM 904 can include a BRAM logic element (BRL) 934 in addition to one or more programmable interconnect elements 930. Typically, the number of interconnect elements included in a tile depends on the height of the tile. In the illustrated example, a BRAM tile has the same height as five CLBs, but other numbers (e.g., four) can also be used. A signal processing block 906 can include a DSP logic element (DSPL) 936 in addition to an appropriate number of programmable interconnect elements 930. An input/output block 908 can include, for example, two instances of an input/output logic element (IOL) 938 in addition to one instance of the programmable interconnect element 930. As will be clear to those of skill in the art, the actual I/O pads connected, for example, to the input/output logic element 938 typically are not confined to the area of the input/output logic element 938.

In the illustrated example, a horizontal area near the center of the die is used for configuration, clock, and other control logic. Vertical columns 940 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 912 spans several columns of CLBs and BRAMs.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA, more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:
1. An amplifier comprising:
a first capacitor electrically connected between a first power supply node and a first node;
a second capacitor electrically connected between the first node and a second node;
a third capacitor electrically connected between a second power supply node and a third node;

a fourth capacitor electrically connected between the third node and a fourth node;
a first transistor having a gate node electrically connected to the second node;
a second transistor having a gate node electrically connected to the fourth node; and
an output node configured to be selectively electrically connected to the first transistor and the second transistor,
wherein the first node and the third node are configured to be selectively electrically connected to a voltage node and a common voltage node.

2. The amplifier of claim 1, wherein the second node is configured to be selectively electrically connected to a first bias voltage node, and the fourth node is configured to be selectively electrically connected to a second bias voltage node.

3. The amplifier of claim 1 further comprising a first switch configured to selectively electrically connect the first node and the third node to the voltage node, wherein the first node and the third node are a same node.

4. The amplifier of claim 3 further comprising a second switch configured to selectively electrically connect the first node and the third node to the common voltage node.

5. The amplifier of claim 1 further comprising:
a first switch configured to selectively electrically connect the first node to the voltage node; and
a second switch configured to selectively electrically connect the third node to the voltage node, the first switch being physically distinct from the second switch.

6. The amplifier of claim 5 further comprising:
a third switch configured to selectively electrically connect the first node to the common voltage node; and
a fourth switch configured to selectively electrically connect the third node to the common voltage node, the third switch being physically distinct from the fourth switch.

7. The amplifier of claim 1, wherein:
the first node and the third node are configured to be electrically connected to the voltage node during a first period, and
the first node and the third node are configured to be electrically disconnected from the voltage node during a second period.

8. The amplifier of claim 7, wherein:
the first node and the third node are configured to be electrically disconnected from the common voltage node during the first period, and
the first node and the third node are configured to be electrically connected to the common voltage node during the second period.

9. The amplifier of claim 8, wherein the output node is configured to be electrically disconnected from the first transistor and the second transistor during the first period, and electrically connected with the first transistor and the second transistor during the second period.

10. The amplifier of claim 9 further comprising:
a first switch configured to:
electrically connect the second node to a first bias node during the first period; and
electrically disconnect the second node from the first bias node during the second period; and
a second switch configured to:
electrically connect the fourth node to a second bias node during the first period; and
electrically disconnect the fourth node from the second bias node during the second period.

11. An analog to digital converter (ADC) comprising:
an amplifier comprising:
a first capacitor electrically connected between a first power supply node and a first node;
a second capacitor electrically connected between the first node and a second node;
a third capacitor electrically connected between a second power supply node and a third node;
a fourth capacitor electrically connected between the third node and a fourth node;
a first transistor having a gate node electrically connected to the second node;
a second transistor having a gate node electrically connected to the fourth node; and
an output node configured to be selectively electrically connected to the first transistor and the second transistor,
wherein the first node and the third node are configured to be selectively electrically connected to a voltage node and a common voltage node.

12. The ADC of claim 11, wherein the second node is configured to be selectively electrically connected to a first bias voltage node, and the fourth node is configured to be selectively electrically connected to a second bias voltage node.

13. The ADC of claim 11, wherein the amplifier further comprises:
a first switch configured to selectively electrically connect the first node and the third node to the voltage node, wherein the first node and the third node are a same node, and
a second switch configured to selectively electrically connect the first node and the third node to the common voltage node.

14. The ADC of claim 11, wherein the amplifier further comprises:
a first switch configured to selectively electrically connect the first node to the voltage node;
a second switch configured to selectively electrically connect the third node to the voltage node, the first switch being physically distinct from the second switch;
a third switch configured to selectively electrically connect the first node to the common voltage node; and
a fourth switch configured to selectively electrically connect the third node to the common voltage node, the third switch being physically distinct from the fourth switch.

15. The ADC of claim 11, wherein:
the first node and the third node are configured to be electrically connected to the voltage node during a first period;
the first node and the third node are configured to be electrically disconnected from the voltage node during a second period;
the first node and the third node are configured to be electrically disconnected from the common voltage node during the first period; and
the first node and the second node are configured to be electrically connected to the common voltage node during the second period.

16. The ADC of claim 15, wherein the output node is configured to be electrically disconnected from the first transistor and the second transistor during the first period and configured to be electrically connected with the first transistor and the second transistor during the second period.

17. The ADC of claim 15, wherein the amplifier further comprises:
- a first switch configured to:
  - electrically connect the second node with a first bias node during the first period; and
  - electrically disconnect the second node from the first bias node during the second period; and
- a second switch configured to:
  - electrically connect the fourth node a second bias node during the first period; and
  - electrically disconnect the fourth node from the second bias node during the second period.

18. A method for operating an amplifier, the method comprising:
- electrically connecting, during a first period, a first node and a second node to a voltage node, wherein a first capacitor is electrically connected between the first node and a first power supply node, a second capacitor is electrically connected between the first node and a third node, a third capacitor is electrically connected between the second node and a second power supply node, and a fourth capacitor is electrically connected between the second node and a fourth node;
- electrically connecting, during a second period, the first node and the second node to a common voltage node; and
- electrically connecting, during the second period, a first transistor and a second transistor to an output node, wherein a gate node of the first transistor is electrically connected to the third node, and a gate node of the second transistor is electrically connected to the fourth node.

19. The method of claim 18 further comprising electrically connecting, during a third period, the third node to a first bias voltage node, and the fourth node to a second bias voltage node.

20. The method of claim 19 further comprising:
- electrically disconnecting, during a fourth period, the first transistor and the second transistor from the output node.

* * * * *